United States Patent [19]

Doscher

[11] Patent Number: 5,007,969

[45] Date of Patent: Apr. 16, 1991

[54] LOW TOXICITY LIQUID SOLVENT

[75] Inventor: Patrisha A. Doscher, Kent, Wash.

[73] Assignee: The Boeing Company, Seattle, Wash.

[21] Appl. No.: 196,903

[22] Filed: May 20, 1988

[51] Int. Cl.$^5$ .................. C09D 9/00; C11D 7/26; C11D 7/50; C23G 5/02

[52] U.S. Cl. .................................... 134/38; 134/31; 134/40; 252/170; 252/171; 252/364; 252/DIG. 8; 430/329; 430/331

[58] Field of Search ......... 252/170, 171, 364, DIG. 8; 134/38, 40, 42, 31; 430/329, 331

[56] References Cited

U.S. PATENT DOCUMENTS

| | | | |
|---|---|---|---|
| 2,932,618 | 4/1960 | Oberdorfer | 252/143 |
| 2,935,479 | 5/1960 | Oberdorfer, Jr. | 252/170 |
| 2,971,920 | 2/1961 | Wurmbock | 252/143 |
| 3,150,048 | 9/1964 | Hollub | 252/170 |
| 3,382,181 | 5/1968 | Oberdorfer, Jr. | 252/364 |
| 3,796,602 | 3/1974 | Briney et al. | 134/42 |
| 4,508,634 | 4/1985 | Elepano et al. | 252/DIG. 8 |
| 4,594,111 | 6/1986 | Coonan | 134/3 |
| 4,645,617 | 2/1987 | Vivian | 252/165 |
| 4,680,133 | 7/1987 | Ward | 252/153 |
| 4,781,916 | 11/1988 | Papaphilippou | 252/162 |
| 4,801,331 | 1/1989 | Murase | 252/364 |
| 4,822,723 | 4/1989 | Dhillon | 430/331 |

Primary Examiner—Dennis Albrecht
Attorney, Agent, or Firm—Christensen, O'Connor, Johnson & Kindness

[57] ABSTRACT

Liquid solvent mixtures having superior cleaning power, especially for photoresist and fingernail enamel, include polar compounds, such as ethylene diacetate, and alicyclic carbonates, such as ethylene carbonate. The solvent mixtures exhibit a low toxicity and have chemical and physical properties that reduce the risk of exposing the user to other unnecessary hazardous conditions.

8 Claims, 11 Drawing Sheets

LOW TOXICITY LIQUID SOLVENT

BACKGROUND OF THE INVENTION

The present invention relates to liquid organic solvents.

Organic solvents are useful as cleaners in high technological industries, such as the aerospace and electronic industry, as well as in every day applications encountered in the typical household. Solvent cleaning is currently accomplished using a variety of highly or modrately toxic solvents. Because of the growing concern for personal safety, personal health and the environment, both the federal and state governments are promulgating increasingly stringent criteria which solvent manufacturers and users must comply with to ensure the health and safety of those working with and around such solvents. For instance, the California state legislature limits the use of volatile solvents by requiring that they have a vapor pressure below about 45 mm Hg at 20° C. In addition, environmental concerns and regulations require that such solvents be disposed of in a manner that will not adversely affect the environment. For many users of such solvents, this disposal generally translates into increased operating costs.

A primary consideration to the user of an organic solvent is the toxicity of the components making up the solvent mixture. Although personal safety can be promoted primarily by preventing direct contact and exposure to such solvents by not exceeding published threshold values, such generalized policies do not take into consideration individual sensitivities or the possibility of an accidental exposure to amounts in excess of the threshold values. The flammability, volatility, cleaning ability, stability during storage, and odor are other factors that are considered by the user in choosing a particular solvent. One solvent that has found widespread application in industrial applications, such as the aerospace industry, is methylethylketone (MEK). Although MEK is generally considered a satisfactory solvent from a cleaning effectiveness standpoint, there is a growing concern that the toxicity and flammability of MEK exposes users to unnecessary risks. Moreover, the expense associated with the safe disposal of MEK is 5 to 10 times greater than the amount the user initially pays for the MEK.

Therefore, increasing efforts are being devoted to developing substantially nontoxic solvents that exhibit low flammability, superior cleaning ability, have a pleasant odor, and are stable during storage. Such solvents will be safe to use not only in large scale industrial applications, but also on the much smaller scale encountered in every day household cleaning chores.

SUMMARY OF THE INVENTION

The present invention is a liquid solvent that exhibits low toxicity and superior cleaning ability. The solvent includes a mixture of an alicyclic carbonate and a polar compound selected from the group consisting of alkyl diethers, alkyl diesters, and alkyl compounds containing both ester and ether groups. A preferred alicyclic carbonate is ethylene carbonate, and a preferred polar compound is ethylene diacetate. The polar compound is preferably capable of forming a liquid mixture with the alicyclic carbonate at a temperature below the normal solidifying temperature of the alicyclic carbonate. When the preferred ethylene carbonate and ethylene diacetate are mixed in about equal volumes, an eutectic mixture is formed that has enhanced handling and reclaiming properties. In mixtures different from the eutectic composition, the eutectic will be present with an excess of one compound. When such a solution is solidified, either the eutectic will solidify leaving the excess component or the excess component will solidify, leaving the eutectic.

The eutectic composition can be combined with other components to form further improved solvents. Additives can be used to reduce the surface tension of the solvent; increase its ability to clean greases and oils, and reduce its aggressiveness for acrylics. The solvent effectively removes residues such as oils, greases, epoxy resins, organic adhesives, waxes, photoresist, inks, or fingernail enamel from solid substrates.

The present invention provides a low toxicity solvent that effectively dissolves many residues. The preferred solvent is essentially nonflammable and has a vapor pressure that is well below the ranges established by various governmental agencies as being acceptable to insure personal safety and reduce long-term health risks due to excessive exposure. The nonhazardous nature of the solvent reduces the degree of user apprehension normally associated with the use of solvents that expose the user to questionable hazards and toxicological risks. The solvent is virtually odor free and is stable under storage conditions. Further, the increasing costs normally associated with the disposal of toxic hazardous substances are circumvented or reduced because the low toxicity of the present invention allows it to be disposed of by means that are less costly than the means necessary to dispose of hazardous substances.

Other objects, features, and advantages of the present invention will be readily apparent from the following description of certain preferred embodiments thereof, taken in conjunction with the accompanying drawings. It is to be understood that variations and modifications may be affected without departing from the spirit and scope of the novel concepts of the present invention.

DETAILED DESCRIPTION OF THE INVENTION

Figure 1:
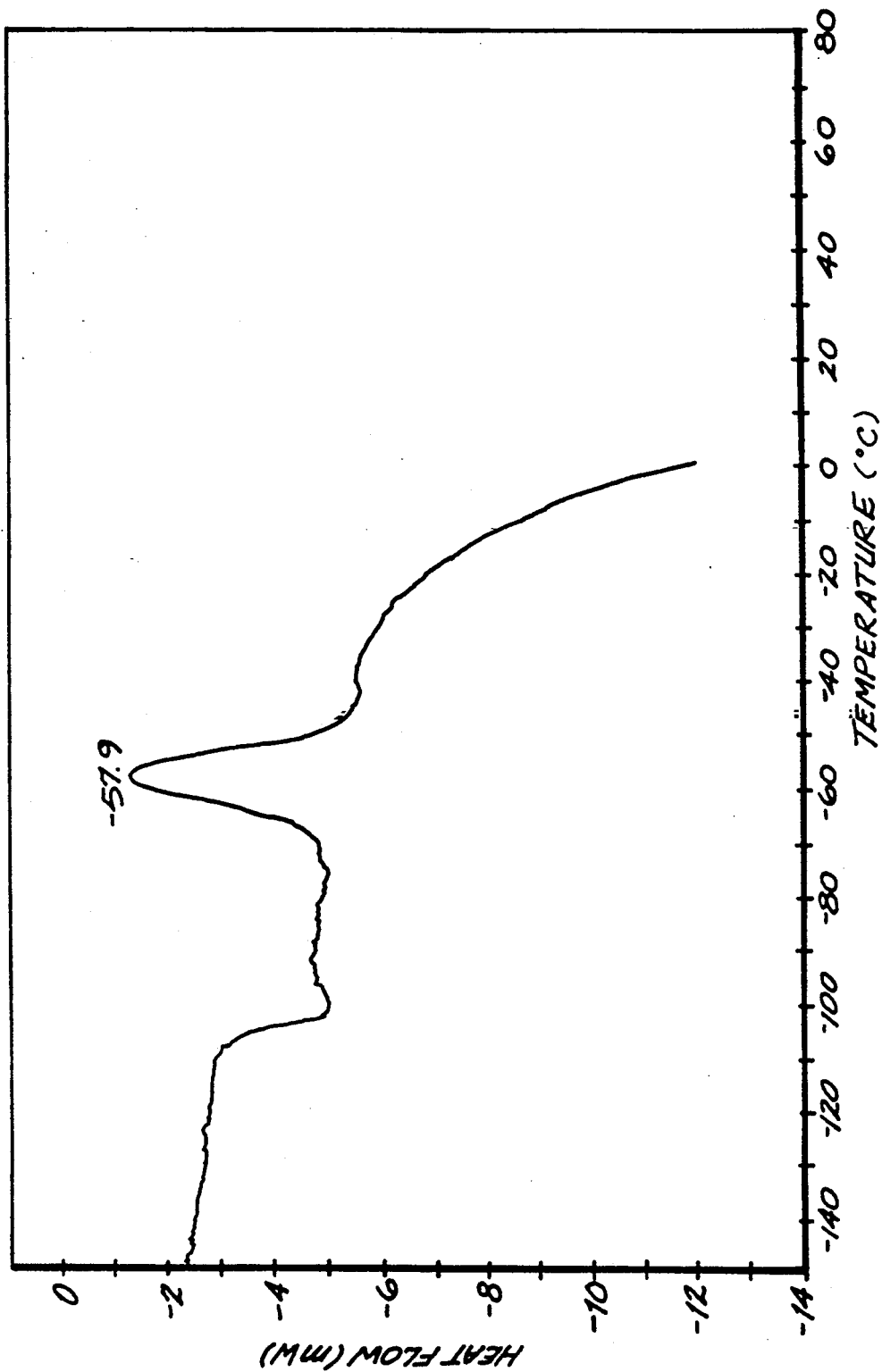
FIGS. 1 through 11 graphically illustrate the results of a differential scanning calorimetry analysis of different formulations of the liquid solvent in accordance with the present invention.
Figure 2:
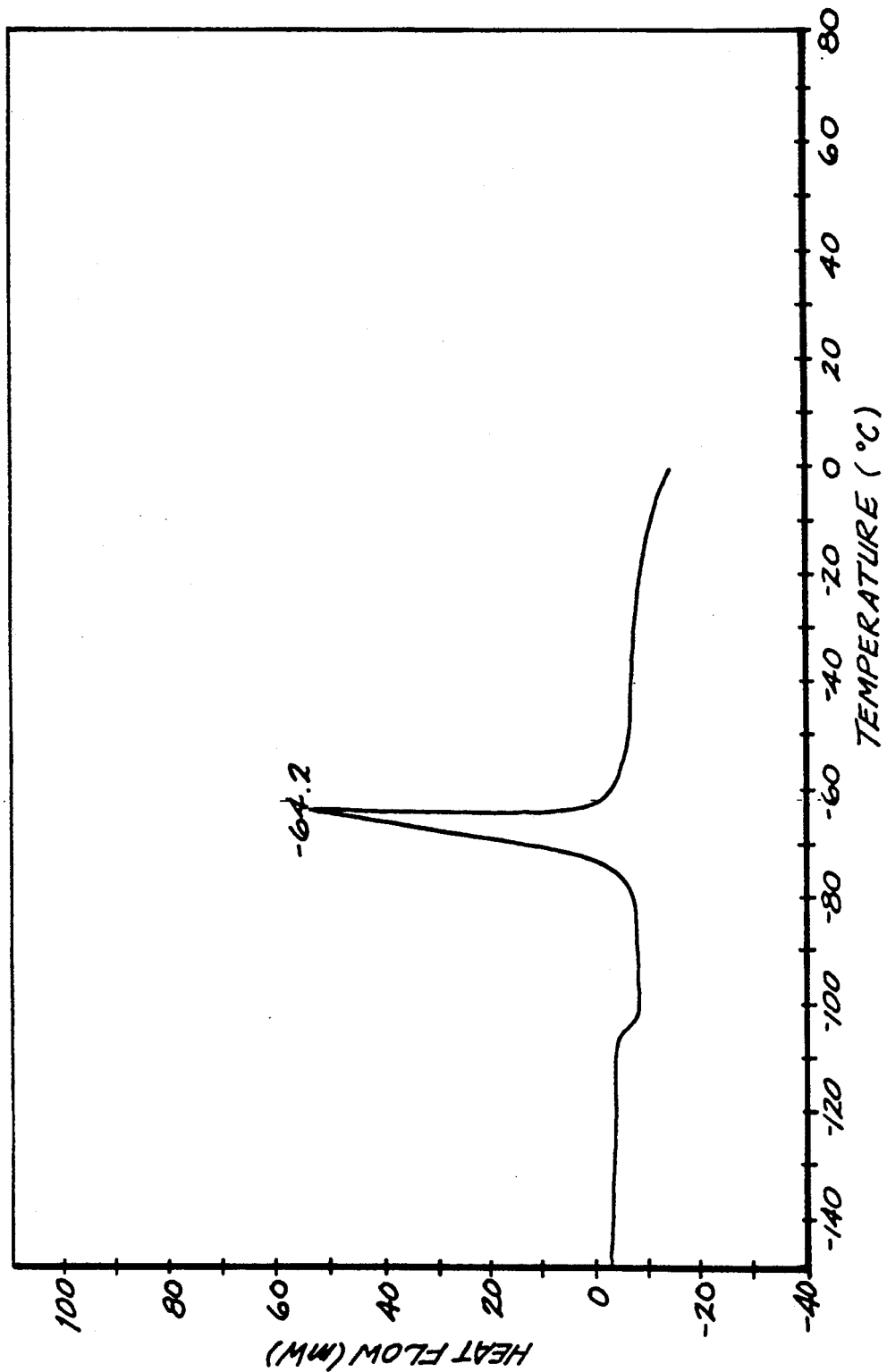
Figure 3:
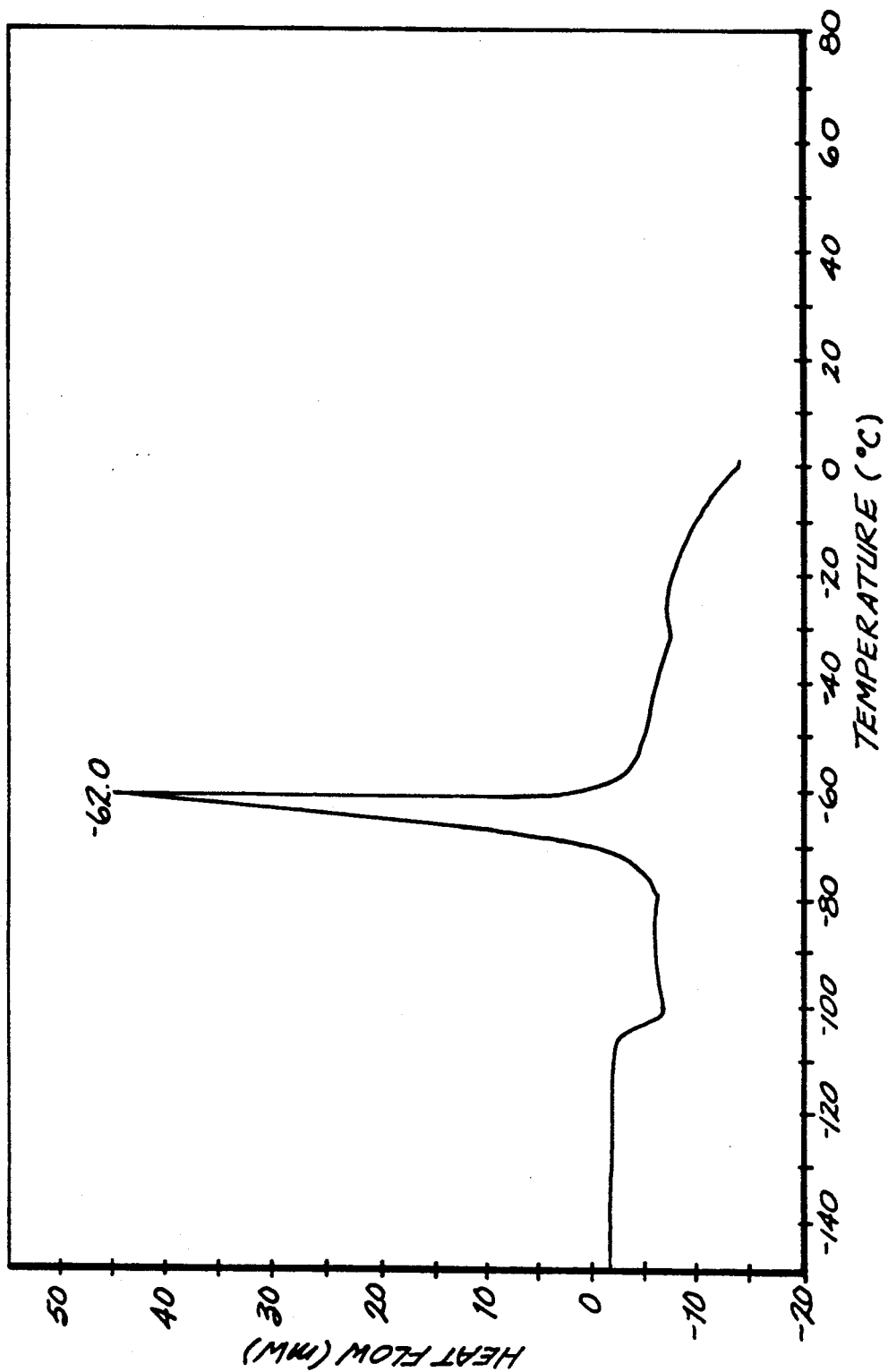
Figure 4:
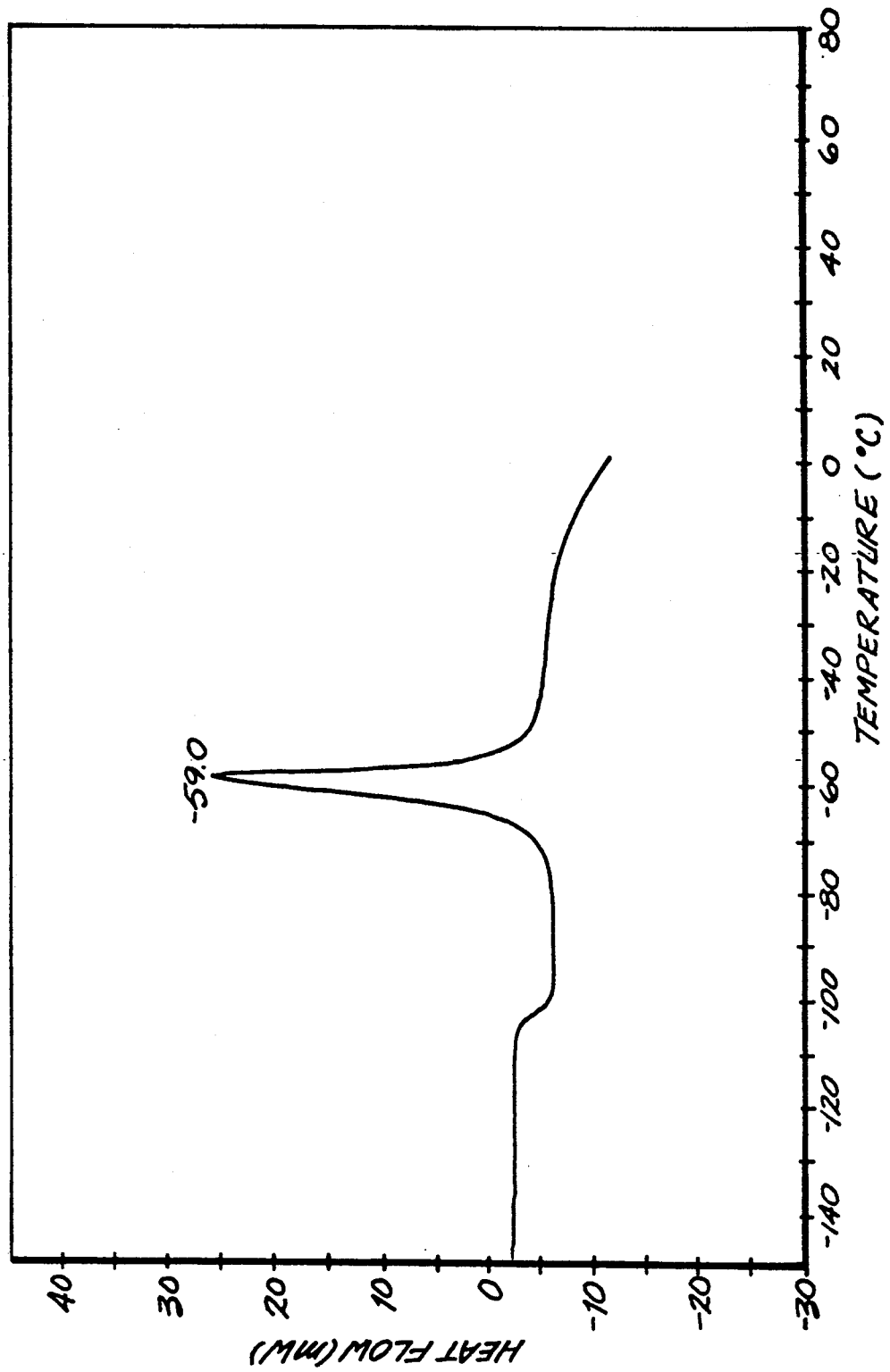
Figure 5:
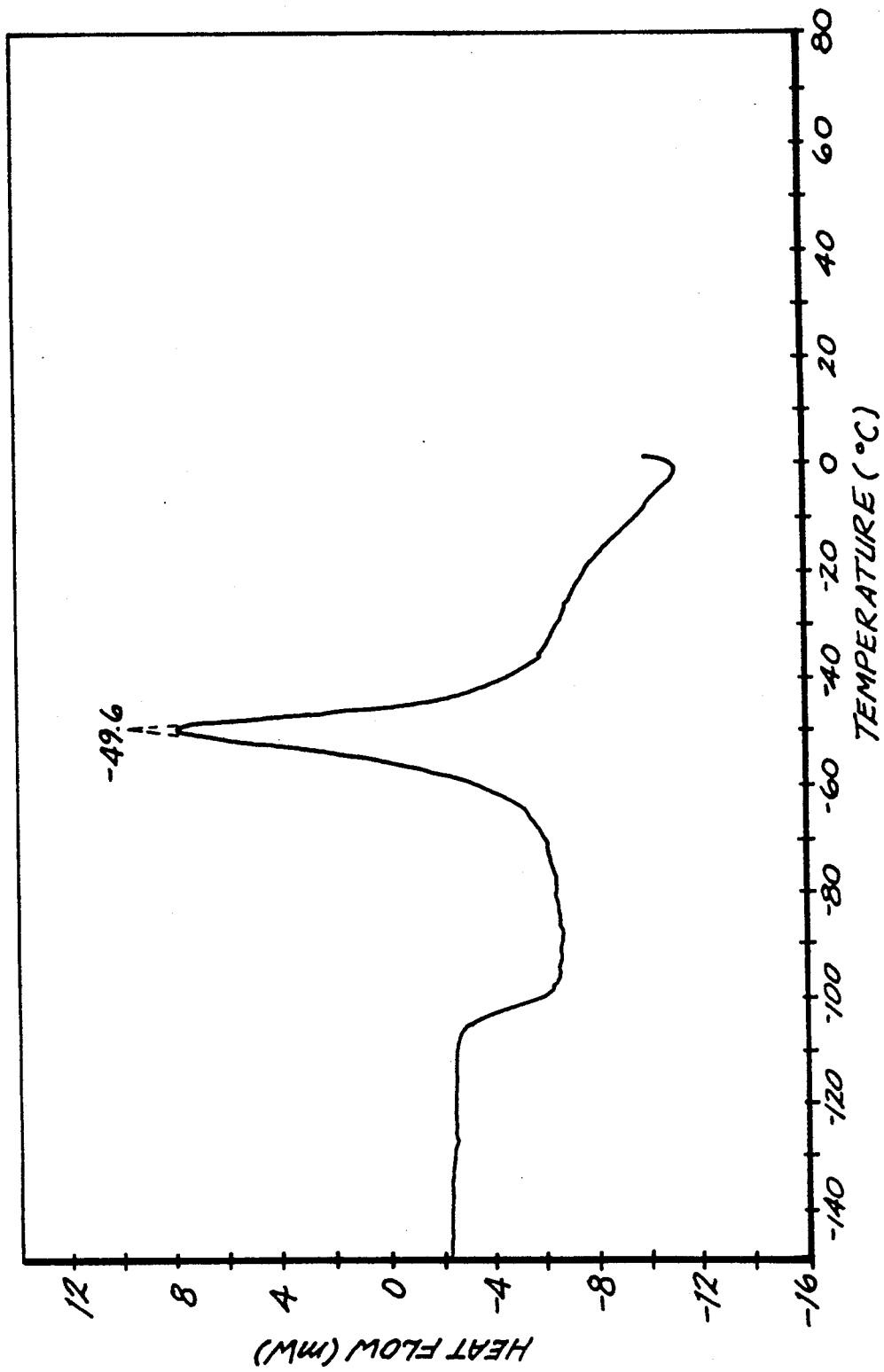
Figure 6:
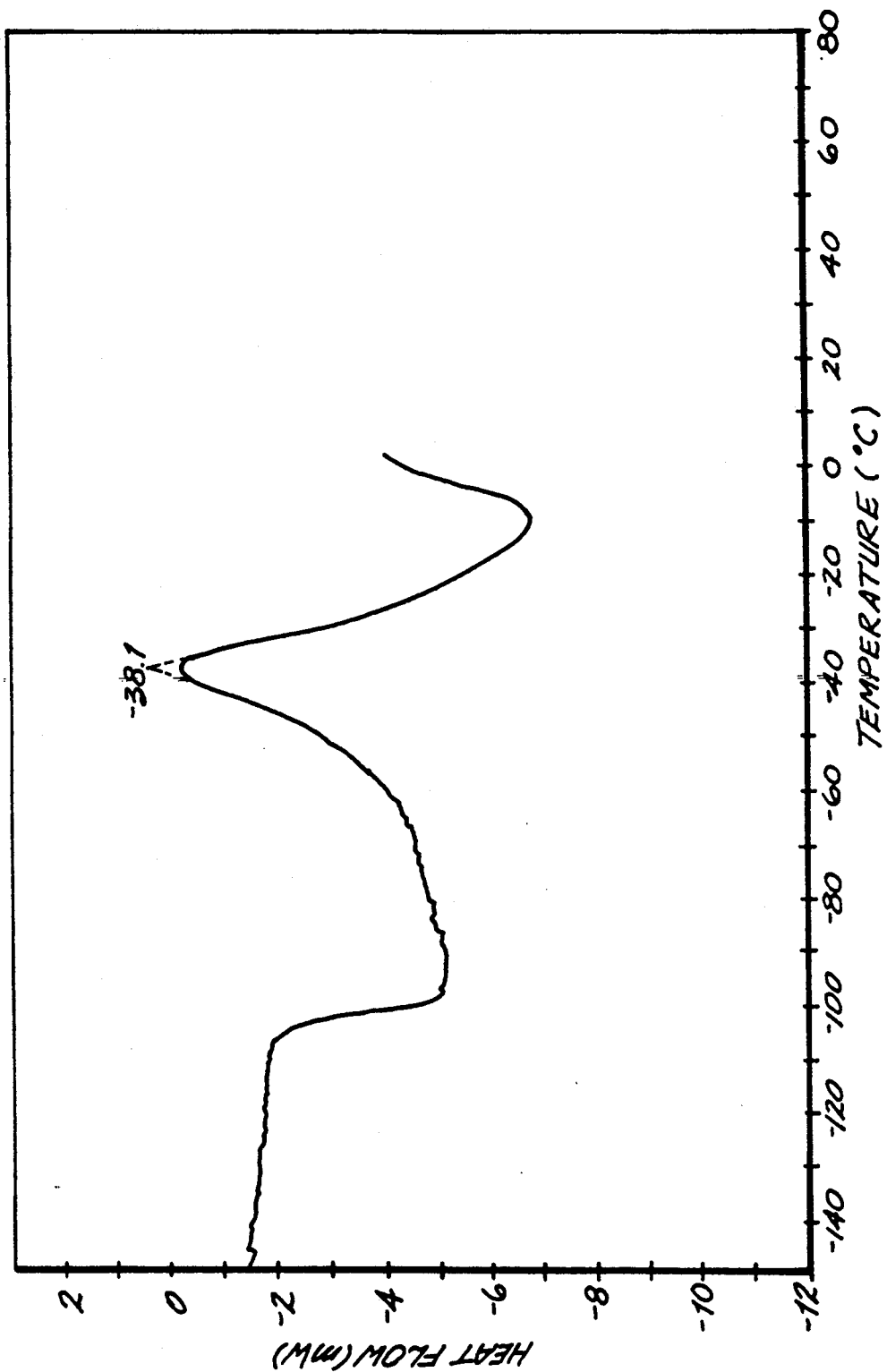
Figure 7:
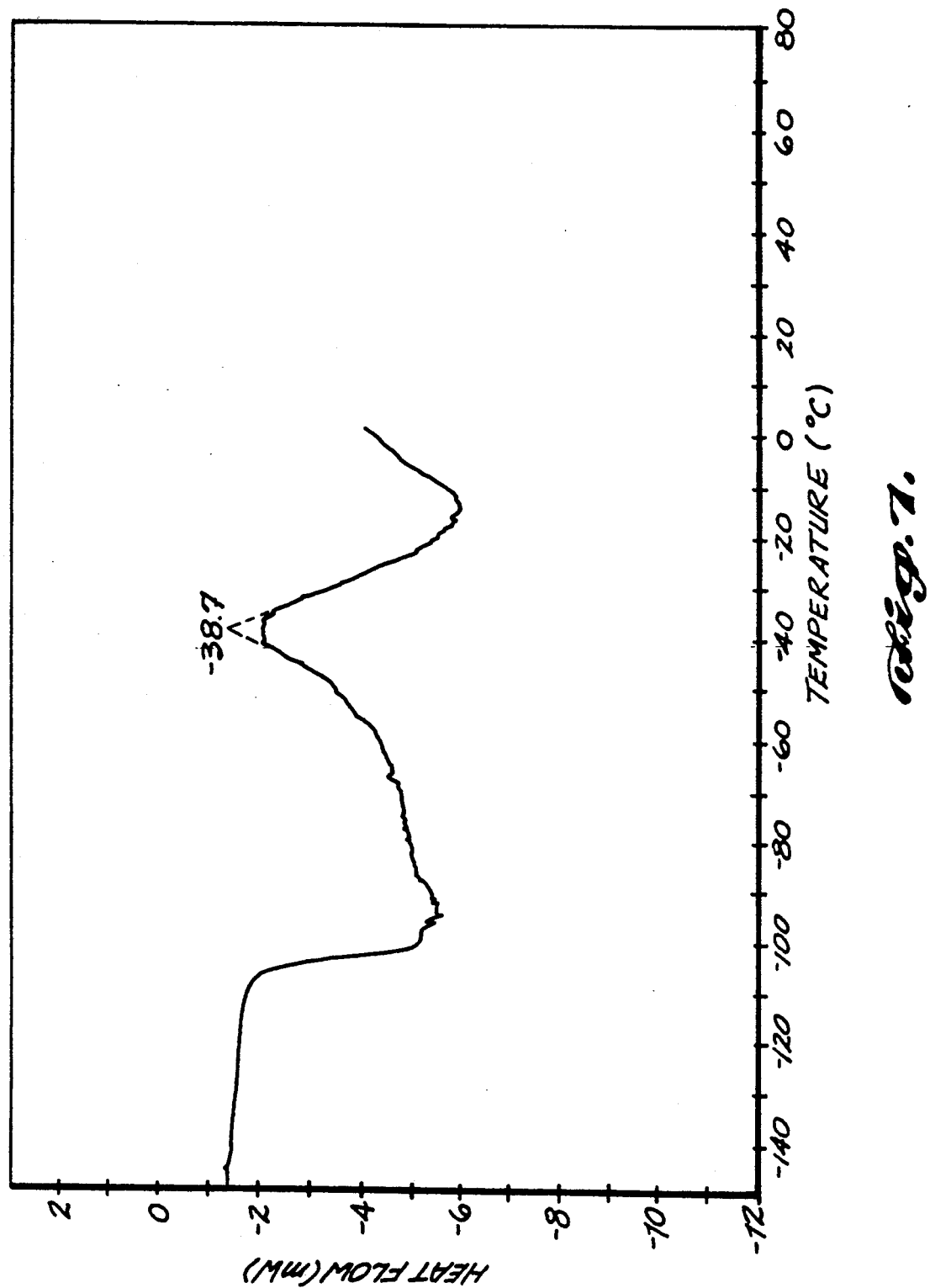

As an overview, it has been found that a particularly effective aprotic liquid solvent is provided when a liquid mixture of an alicyclic carbonate and a polar compound selected from the group consisting of alkyl diethers, alkyl diesters, and alkyl compounds containing both ester and ether groups, is formed. For example, it has been found that a preferred mixture of ethylene diacetate and ethylene carbonate provides a liquid solvent with superior cleaning properties. Generally, the mixtures exhibit a solidifying temperature that is below the normal solidification temperature of its alkylene carbonate component; for instance, a depression of the solidification point of ethylene carbonate below about 36.4° C. Preferably, the resulting mixture is a liquid at or near ambient temperatures.

The polar compounds which are useful in the present invention are generally of the type that include at least one electronegative oxygen capable of dissolving the alicyclic carbonate and residues to be cleaned. With regard to the alicyclic carbonate, the electronegativity of the oxygen enables the polar compound to form a liquid mixture with the alicyclic carbonate at temperatures below the normal solidifying point of the alicyclic carbonate, preferably at room temperature. The affinity between the electronegative oxygen and the alicyclic carbonate is stronger than the affinity between adjacent alicyclic carbonate molecules when it solidifies. Thus, the polar compounds are able to dissolve the alicyclic carbonates under conditions at which the alicyclic carbonate would normally be a solid. This is particularly advantageous when the alicyclic carbonate is the preferred ethylene carbonate which is normally a solid at temperatures below about 36.4° C.

The polar compound preferably includes the strongly polar alkyl diesters, alkyl diethers, or alkyl compounds containing both an ester and an ether group that contain two electronegative oxygen containing groups. The most preferred polar compounds are the alkyl diethers and alkyl diesters which are symmetric or nearly symmetric. Examples of symmetric polar compounds include ethylene diacetate, ethylene dibutyrate (alkylene dialkylates), ethylene glycol diethyl ether, ethylene glycol dimethyl ether (alkylene glycol dialkyl ethers), butyl diglycol carbonate, and dimethyl glutarate. A preffered symmetric polar compound is ethylene diacetate. Although asymmetric compounds may be equally useful, the symmetric polar compounds are preferred because of their stronger electronegative oxygen containing groups compared to the electronegativity of the oxygen groups in the asymmetric compounds. Examples of asymmetric polar compounds include ethylene glycol monoacetate and ethyl-3-ethoxy propionate. Preferably, the polar compound is saturated so that the oxygen containing group or groups in the molecular chain can rotate freely enabling them to more readily adapt to and dissolve the alicyclic carbonate and residue.

Accordingly, the aprotic solvent of the present invention generally includes a mixture of an alicyclic carbonate and a dipolar alkyl diether or diester (particularly a eutectic mixture of ethylene carbonate and ethylene diacetate) which combines an exposed oxygen on the alicyclic carbonate with the solvent properties of the dipolar diether or diester.

Ethylene diacetate is a colorless liquid that exhibits a faint odor and is soluble in water in amounts up to about 10%. The boiling point of ethylene diacetate is 190.5° C., and its freezing point is −41.5° C. The vapor pressure exhibited by ethylene diacetate at 20° C. is 0.3 mm Hg and its flashpoint is 96.4° C. Ethylene diacetate is generally considered a low-toxic solvent for such things as cellulose esters and ethers, resins, lacquers, and printing inks. Ethylene diacetate may be derived from either ethylene glycol and acetic acid or ethylene dichloride in sodium acetate.

Ethylene carbonate, the preferred alicyclic carbonate, is a colorless, odorless solid at temperatures below about 36.4° C. The boiling point of ethylene carbonate is 248° C. and its flashpoint is 143.7° C. Ethylene carbonate is miscible with water, alcohol, ethyl acetate, benzene, and chloroform and is soluble in ether, n-butanol, and carbon tetrachloride. Ethylene carbonate is generally considered a low toxic solvent for many polymers and resins, and is useful in solvent extractions, the synthesis of pharmaceuticals, rubber chemicals, and textile finishing agents. One method of preparing ethylene carbonate is by the interaction of ethylene glycol with phosgene.

Another preferred alicyclic carbonate is propylene carbonate, which, like ethylene carbonate, is an odorless, colorless liquid at temperatures above about −49.2° C. The boiling point of propylene carbonate is 241.7° C. and its flashpoint is 132.5° C. Propylene carbonate is miscible with acetone, benzene, chloroform, ether, and ethyl acetate and is moderately soluble in water and carbon tetrachloride. Propylene carbonate is useful in solvent extractions, as a plasticizer, inorganic in synthesis, in natural gas purification and as a synthetic fiber spinning solvent. Ethylene carbonate is the preferred alicyclic carbonate because the electronegativity of the exposed oxygen is greater in ethylene carbonate than in the propylene carbonate or other alicyclic carbonates.

It is the electronegativity of the oxygen containing groups of the polar compound in combination with the electronegativity of the carbonate group in the alicyclic carbonate which enables the present invention to exhibit its superior cleaning ability. Intermolecular interactions between the molecules of the solvent mixture and the residue involves varying degrees of Van der Waals type bonding which are generally stronger than the molecular interactions between molecules of the residue and between molecules of the residue and molecules of the substrate. The stronger intermolecular interaction between the solvent molecules and residue molecules enables the solvent mixture of the present invention to be a superior cleaner for many residues.

A preferred liquid solvent of the present invention includes about 40 to about 95 volume percent ethylene diacetate with the remainder ethylene carbonate. The preferred mixtures are liquids at or around room temperature, i.e., 20° C. The amounts of ethylene diacetate and ethylene carbonate, within the above range, will be varied primarily upon consideration of the particular purpose for which the solvent is being used. It should be understood that the particular volume percents are based on the total volume of the ethylene diacetate and ethylene carbonate. If the material to be removed is more soluble in either the ethylene diacetate or the ethylene carbonate component, then the concentration of that component should predominate. The 40–95 volume percent rule should be satisfied to have a liquid mixture at room temperature. A preferred mixture includes between about 45 to about 55 volume percent ethylene diacetate and the remainder ethylene carbonate. Although the 40–95 volume percent range is preferred for room temperature uses, any proportions of ethylene diacetate and ethylene carbonate that provide a liquid can probably be used. For instance, where the proportions of ethylene carbonate and ethylene diacetate are not able to provide a liquid mixture at or around room temperature, i.e., ethylene carbonate in amounts greater than about 60 volume percent, heating of the mixture to an elevated temperature will provide a liquid mixture. The most preferred mixture is the eutectic composition.

Generally, when the solvent mixture of the present invention solidifies, the composition which solidifies at the lowest temperature (i.e., the eutectic) will solidify as a constant composition solid regardless of the original proportions of the components in the liquid mixture. As the temperature of the mixture is lowered, portions of the alicyclic carbonate will solidify out of the mixture until the composition of the mixture achieves the eutectic composition at which point both the alicyclic carbonate and the polar compound will solidify as a constant composition. For the preferred mixture containing ethylene carbonate and ethylene diacetate, it is believed the eutectic composition is about 50 volume percent ethylene carbonate with the remainder ethylene diacetate.

The use of the particular eutectic composition has several advantages related to the handling properties of the solvent and the cleaning or reclamation of the solvent. For instance, since the eutectic composition solidifies and vaporizes at a constant composition, it may easily be separated and recovered by vacuum distillation or zone recrystallization (wherein the solvent is frozen from a mixture of the solvent, residue and recovery fluid.) Additional methods of reclaiming the solvent include solvent extraction using water (as a second fluid) or any other suitable recovery means. The spent solvent, filled with residue, can usually be buried without special precaution or the fear of generating hazardous wastes.

The solvent of the present invention can also include other additives that are used to address specific cleaning problems and provide further improved solvents. The selection of the particular additives and the amounts used should be consistent with the objective of providing a solvent with a low vapor pressure that is essentially nonflammable, odorless, clear, and nontoxic. For example, alcohols, such as decanol, sulfonated amines, or ethyl-3-ethoxy propionate may be added as surfactants to decrease the surface tension of the solvent mixture. Further, propylene glycol or another soluble, less active solvent can be used to dilute the liquid solvent mixture to reduce the power or aggressiveness the solvent has, for example, for acrylics. Moderate to high molecular weight alcohols or esters, especially the fatty acid esters such as lanolin, the fatty acid alcohols, such as beeswax, or other $C_8$ through $C_{20}$ alkyl alcohols, that are lipophilic, can be used to enhance the ability of the solvent to clean greases and oils. When the lipophilic additives are used, it may be necessary to dissolve the additive in a low molecular weight alcohol, such as ethanol, prior to adding it to the eutectic mixture. Because ethanol has a toxicity greater than the preferred components, it is desirable to minimize the amount used.

It has been found that when a multi-component mixture (i.e., alicyclic carbonate and polar compound plus additives) is formed, it is advantageous to use the eutectic mixture so that the ratio of the preferred ethylene carbonate to ethylene diacetate is preserved when the solvent is recovered and cleaned.

Referring to FIGS. 1-11, the results of a differential scanning calorimetry analysis show that within the ranges disclosed above for providing a liquid mixture of ethylene diacetate and ethylene carbonate at or around room temperature, the mixtures of FIGS. 1-7 exhibit a distinct exotherm at temperatures ranging from about −38° C. to about −64° C. Below is a summarization of the particular compositions graphically represented by FIGS. 1-11:

| FIG. | Vol % Ethylene Diacetate | Vol % Ethylene Carbonate |
|---|---|---|
| 1 | 45 | 55 |
| 2 | 50 | 50 |
| 3 | 55 | 45 |
| 4 | 60 | 40 |
| 5 | 65 | 35 |
| 6 | 70 | 30 |
| 7 | 75 | 25 |
| 8 | 40 | 60 |
| 9 | 80 | 20 |
| 10 | 85 | 15 |
| 11 | 90 | 10 |

Figure 8:
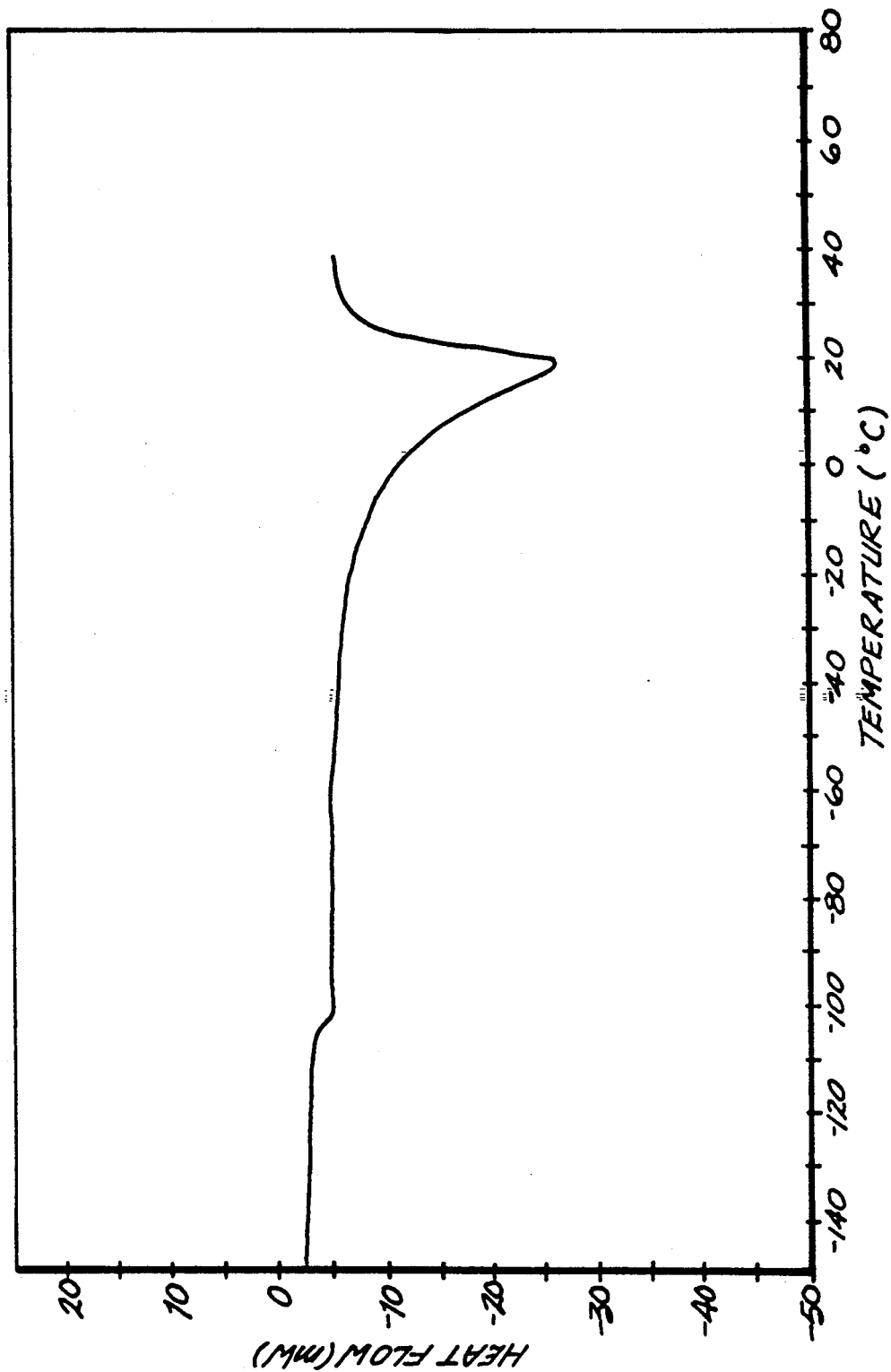

Though not fully understood, it is believed that the exotherms illustrated in FIGS. 1-7 indicate a nucleation of the ethylene diacetate and the ethylene carbonate molecules associated with the formation of a eutectic mixture. Strong intermolecular bonding occurs when enough energy is put into the system to allow molecular orientation into a unique semi-crystalline state and is believed to prevent the individual components from behaving independently and solidifying. The independent behavior of the ethylene carbonate component is undesirable because it results in the ethylene carbonate solidifying out of the solvent mixture at room temperature. This is illustrated by FIG. 8 which does not show an exotherm, but rather exhibits an endotherm at about 20° C. which indicates a portion of the ethylene carbonate solidifying out of the mixture. Although the ethylene carbonate solidifies out of the mixture represented by FIG. 8, the mixture is still a liquid at or around room temperature, i.e., 20° C. and is useful as a solvent within the context of the present invention.

Figure 9:
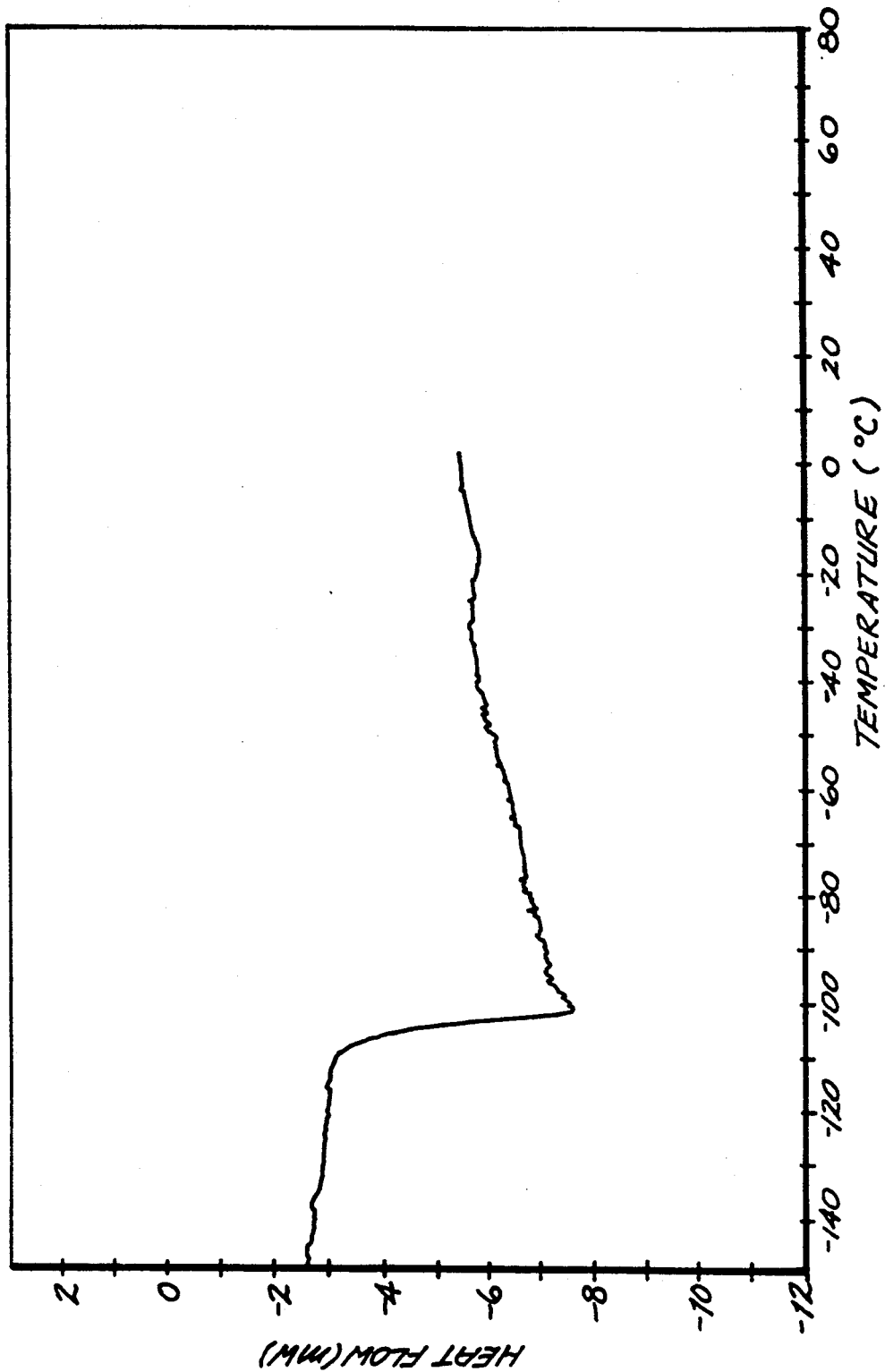
Figure 10:
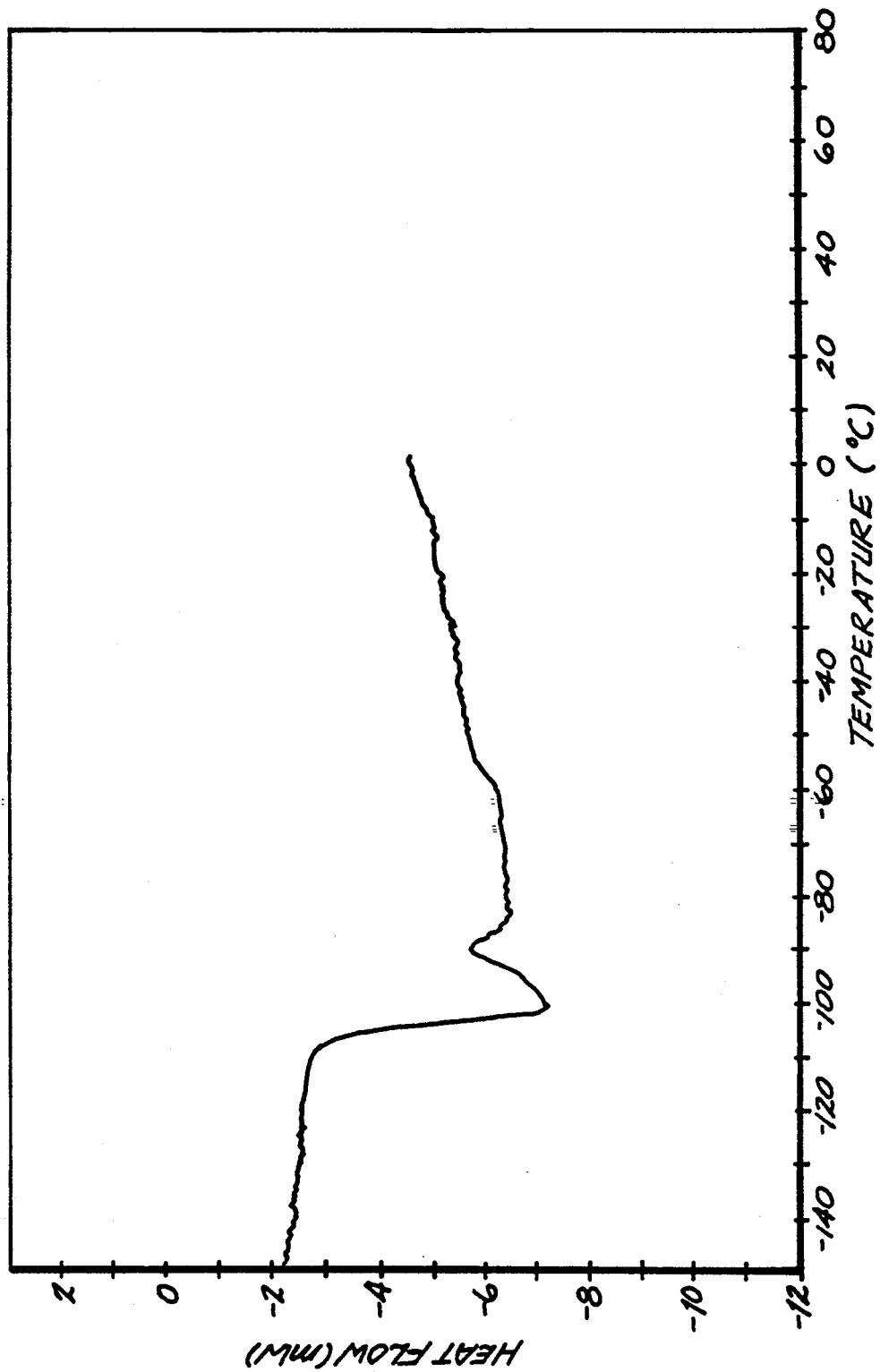
Figure 11:
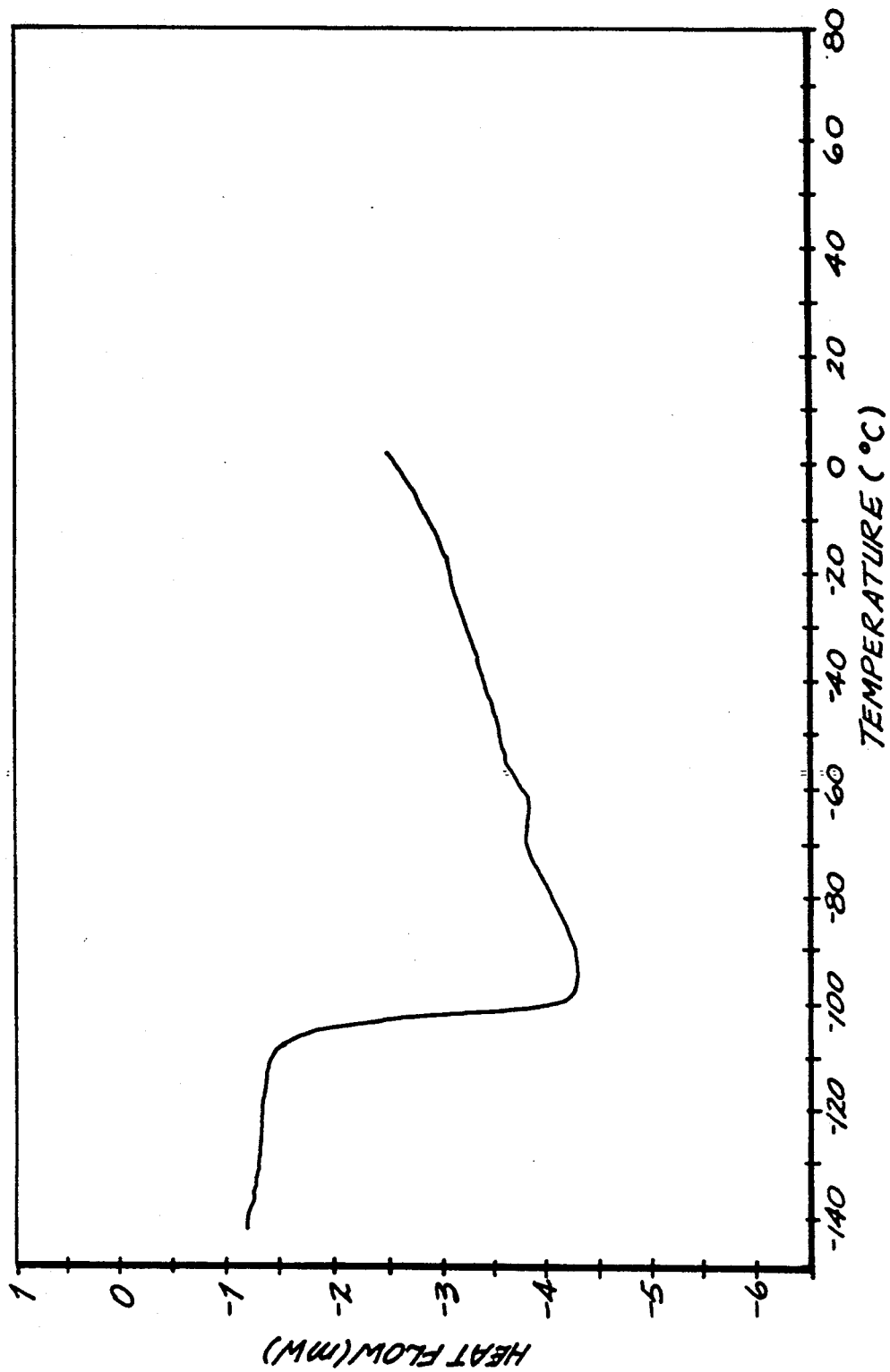

Referring to FIGS. 9-11, there are no exotherms similar to those illustrated in FIGS. 1-7. This is believed to be a result of the dominating effect the excess ethylene diacetate has on the solvent mixture. That is, although some nucleation is occurring between the carbonate and diacetate molecules, the effect is not detectable by the differential scanning calorimeter because the heat associated with the nucleation is negligible or is absorbed by the ethylene diacetate. Nevertheless, the mixtures represented by FIGS. 9-11 still provide liquid mixtures of ethylene diacetate and ethylene carbonate that are within the scope of the present invention. It is believed that the exotherms in FIGS. 1-7 demonstrate the eutectic of the solvent mixture. The ability to evaporate the eutectic mixture (FIG. 2) of the ethylene diacetate and ethylene carbonate to dryness without crystallization of the ethylene carbonate further supports this belief.

The solvents of the present invention exhibit properties that are particularly advantageous when taking into consideration the increasing concern for user safety and health. For instance, the liquid mixtures of the present invention exhibit a vapor pressure that is less than about 1 mm Hg at 20° C., which means that at ambient conditions, the user will not be exposed to unnecessarily large amounts of solvent vapor that are normally associated with conventional solvents having higher vapor pressures. Further, the low vapor pressure of the mixtures of the present invention translates into a decreased flammability risk, as well as virtually removing the risk of auto-ignition of the solvent vapors. In fact, the preferred solvent mixtures have a flashpoint greater than about 93.7° C. and would be categorized as a noncombustible liquid according to the Occupational Safety and Hazards Administration (OSHA) standards.

The solvent mixture without additives is essentially odorless, and is substantially neutral based on ASTM-D1093 for measuring pH. Further, the present solvents do not exhibit the photochemical reactivity that is generally associated with the halogenated solvents that they are targeted to replace in industry. Another advantage of the solvent mixture of the present invention is its relatively high vaporization/boiling temperature that allows the liquid solvent mixture to be used in heated baths or as a hot mixture without losing a substantial portion of the solvent to uncontrolled vaporization.

The solvent mixture of the present invention exhibits moderate solubility in water, but is not believed to be hygroscopic. The moderate solubility is advantageous because, when applied to a metallic substrate, the mixture will not contain excessive water that could promote corrosion of the metal. Further, the mixture can be recovered by decanting from water that is normally used to rinse the solvent from the cleaned substrate. The solvent mixture of the present invention is both simple and economical to produce. For example, liquid ethylene carbonate is added to the ethylene diacetate while stirring. Solid ethylene carbonate can be added, but it must then dissolve. The mixture is generally stable when sealed at room temperature.

The solvent mixture is used as a cleaner using conventional techniques. It can be applied with a cleaning rag or brush prior to scrubbing or it may be sprayed on. A part coated with residue can also be immersed in a bath of the solvent mixture, where ultrasound or other agitation may be used to enhance the removal of the residue. Vapor degreasing can also be used. This method involves condensing the solvent mixture on the substrate from a vapor. The amount of solvent used and the contact time required depends on the nature of the residue and the specific composition of the mixture. Satisfactory cleaning can generally be determined visually.

The solvent mixture of the present invention has application as a general purpose solvent for polar and nonpolar residues, such as those generally encountered in the aerospace and electronics industry. The solvent is also an effective, less harsh solvent for fingernail enamel than conventional, commercial enamel removers. Table 1 provides a partial list of residues that may be removed with the solvent.

EXAMPLE 1

Test panels made from 2024-T3 aluminum alloys were alodined, primed with an epoxy primer, and coated with a residue from Table 1. A candidate cleaner was squirted onto the panel and removed with a cleaning rag by hand. A second set of test panels used a glass plate coated with the same residues as used on the alodined aluminum. Cleaning effectiveness was evaluated visually (with a 10 power microscope for the glass slides) according to the key listed below.

0 = no effect on residue
1 = slight effect on residue
2 = removes residue almost completely with rubbing and dwell time
3 = removes residue completely with rubbing and dwell time
4 = removes residue completely with rubbing
5 = removes residue completely by pooling up prior to wiping off
+ = visibly affects paint The candidate cleaners tested included:
1. Hot ethylene carbonate
2. Ethylene diacetate
3. 2-ethylhexyl acetate
4. Ethyl-3-ethoxypropionate
5. Triacetin
6. Propylene carbonate
7. Terpineol
8. 1,2-propylene glycol
9. Methylethylketone (MEK)
10. Tap water
11. 46 vol % ethylene carbonate and 54 vol % ethylene diacetate.

TABLE 1

| | CLEANING EFFECTIVENESS | | | | | | | |
|---|---|---|---|---|---|---|---|---|
| | Chem Mill Oil | Ink (Sharpie) | Writing Ink | COSMOLINE | Ketchup | Lipstick | Labels | Paint |
| Ethylene Carbonate/Ethylene Diacetate | 5 | 5 | 5 | 5 | 5 | 5 | 3 | 0 |
| Hot Ethylene Carbonate | 4 | 5 | 5 | 0 | 3 | 5 | 1 | 0 |
| Ethylene Diacetate | 5 | 5 | 5 | 0 | 3 | 5 | 1 | 0 |
| 2-ethylhexyl Acetate | 5 | 5 | 4 | 0 | 2 | 5 | 1 | 0 |
| Ethyl-3 Ethoxypropionate | 4 | 5 | 5 | 5 | 2 | 3 | 5 | + |
| Triacetin | 4 | 1 | 0 | 5 | 4 | 4 | 0 | 0 |
| Propylene Carbonate | 5 | 5 | 4 | 0 | 3 | 5 | 0 | 0 |
| Terpineol | 0 | 1 | 1 | 4 | 4 | 2 | 3 | 0 |
| 1, 2-Propylene Glycol | 0 | 5 | 4 | 0 | 3 | 5 | 0 | 0 |
| Methylethylketone | 5 | 5 | 5 | 5 | 2 | 2 | 5 | + |
| Tap Water | 0 | 0 | 0 | 0 | 1 | 0 | 0 | 0 |

COSMOLINE is a trademarked corrosion inhibitor of E. F. Haughton

The solvent mixture (Sample 11) of the present invention cleans as well or better than the other conventional solvents tested for removing any residue other than labels.

EXAMPLE 2

Plastic panels listed in Table 2 were immersed in the listed solvents for a period of 168 hours (one week) to test the effect of the solvents on the plastic. The results were visually observed and recorded according to the following key:

+ + = major effect
+ = some effect
− = no effect

The solvents tested were:
1. Propylene carbonate
2. Ethylene diacetate
3. 2-ethylhexyl acetate
4. 1,2-propylene glycol
5. Ethyl-3-ethoxy propionate
6. Triacetin
7. Terpineol
8. Solvent of Example 1 (Sample 11)

TABLE 2

| | Acrylic-Lucite | Polycarb/Lexan | PTFE/Teflon | PVF/Tedlar | Mylar | Fiber/Epoxy Composite | Aramid/Kevlar | ABS/Royalite 50 | Polysulfone Royalite 520 | PVC | Polyacetal | Phenolic | Nylon |
|---|---|---|---|---|---|---|---|---|---|---|---|---|---|
| Ethylene Carbonate/Ethylene Diacetate | − | − | − | − | − | − | − | − | − | − | − | − | − |
| Propylene Carbonate | − | − | + | − | − | − | − | + | − | − | − | − | − |
| Ethylene Diacetate | − | − | − | − | − | − | − | + | − | − | − | − | − |
| 2-ethylhexyl Acetate | − | − | − | − | − | − | − | + | − | − | − | − | − |
| 1, 2-Propylene Glycol | − | − | − | − | − | − | − | − | − | − | − | − | − |
| Ethyl-3-Ethoxy Propionate | + | − | − | − | − | − | − | ++ | − | + | − | − | − |
| Triacetin | − | − | − | − | − | − | − | − | − | − | − | − | − |
| Terpineol | − | − | − | − | − | − | − | − | − | − | − | − | − |

The solvent mixture of the present invention does not adversely affect the plastic substrates tested, unlike many conventional solvents.

EXAMPLE 3

The solvent mixture (Sample 11) of Example 1 was tested for its effectiveness in removing Kodak KPR3 ™ and an Dupont RISTON ™ photoresist and Kodak Thin Film Resist (KTFR ™) from electronic circuitry equipment by contacting the photoresist and etch resist with the solvent. The solvent mixture removed KPR3 ™ and RISTON ™ photoresist effectively upon 30 minutes of soaking without scrubbing. The removal was accelerated by heating the solvent. The solvent did not effectively remove the Kodak Thin Film Resist after a similar treatment.

The present invention provides a liquid solvent mixture that is a nontoxic, nonflammable, and an effective alternative to conventional cleaning solvents like MEK. The preferred mixture of ethylene carbonate and ethylene diacetate out performs most conventional solvents without harming the substrate, be it ceramic, glass, or plastic. The Examples show that the mixture of the present invention out performs ethylene diacetate, and that the mixture is a surprisingly effective solvent for most industrial cleaning applications, including removal of photoresist.

One of ordinary skill, after reading the foregoing specification and claims, will be able to effect various changes, substitutions of equivalents, and other alterations without departing from the broad, inventive, concepts disclosed herein. The claims should be construed broadly in light of the description to include all described embodiments and their equivalents and should only be limited as required by the relevant prior art.

I claim:

1. A low toxicity solvent comprising 40-95 vol % ethylene diacetate and the remainder an alicyclic carbonate including an effective amount of ethylene carbonate, the solvent being aprotic and having a vapor pressure less than or equal to 1 mm Hg at 20° C.

2. The solvent of claim 1 wherein the alicyclic carbonate compound is a mixture of ethylene carbonate and propylene carbonate.

3. The solvent of claim 1 wherein the alicyclic carbonate is only ethylene carbonate.

4. The solvent of claim 1 comprising 45-75% ethylene diacetate.

5. The solvent of claim 1 comprising 45-55 vol. % ethylene diacetate.

6. A method of removing a residue from a solid substrate comprising the step of contacting the residue with an effective amount of the solvent of claim 1.

7. A method for removing photoresist from a substrate comprising the step of contacting the photoresist with an effective amount of the solvent of claim 1.

8. A method for removing fingernail enamel from a substrate comprising the step of contacting the enamel with an effective amount of the solvent of claim 1.

* * * * *